US009379831B2

(12) United States Patent
Nagai et al.

(10) Patent No.: US 9,379,831 B2
(45) Date of Patent: Jun. 28, 2016

(54) ACOUSTIC CONTROLLER

(71) Applicant: Yamaha Corporation, Hamamatsu-shi, Shizuoka-ken (JP)

(72) Inventors: Hisashi Nagai, Hamamatsu (JP); Mizuyuki Shirai, Hamamatsu (JP); Akio Yatsui, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/519,180

(22) Filed: Oct. 21, 2014

(65) Prior Publication Data

US 2015/0109745 A1 Apr. 23, 2015

(30) Foreign Application Priority Data

Oct. 22, 2013 (JP) ................................ 2013-219188

(51) Int. Cl.
*H05K 5/00* (2006.01)
*H04H 60/04* (2008.01)

(52) U.S. Cl.
CPC .................................... *H04H 60/04* (2013.01)

(58) Field of Classification Search
USPC .................................................. 361/752, 721
See application file for complete search history.

(56) References Cited

U.S. PATENT DOCUMENTS

2008/0186689 A1* 8/2008 Koizumi .............. H05K 1/0215 361/752
2008/0198558 A1* 8/2008 Watanabe .......... H05K 7/20545 361/721

FOREIGN PATENT DOCUMENTS

JP 2007-213099 A 8/2007
JP 2008-192800 A 8/2008
JP 2008-205582 A 9/2008

* cited by examiner

*Primary Examiner* — Andargie M Aychillhum
(74) *Attorney, Agent, or Firm* — Crowell & Moring LLP

(57) ABSTRACT

An acoustic controller includes a housing including: an upper cover; a lower casing constituted by a shielding member; and a lower cover mounted on an opposite side of the lower casing from the upper cover. The lower casing partitions an interior of the housing into (i) an upper space formed by the upper cover and the lower casing and (ii) a lower space formed by the lower casing and the lower cover. A first circuit board is disposed in the upper space, and a second circuit board is disposed in the lower space.

8 Claims, 7 Drawing Sheets

ACOUSTIC CONTROLLER

CROSS REFERENCE TO RELATED APPLICATION

The present application claims priority from Japanese Patent Application No. 2013-219188, which was filed on Oct. 22, 2013, the disclosure of which is herein incorporated by reference in its entirety.

BACKGROUND

1. Technical Field

The present invention relates to an acoustic controller used for audio devices such as a mixing console and a recording device.

2. Description of the Related Art

A portable acoustic controller, such as a mixing console and a recording device, as disclosed in Patent Document 1 (Japanese Patent Application Publication No. 2007-213099) includes a housing shaped like a box. This housing includes: an upper surface portion provided with a multiplicity of controls (operating members) such as fader controls and rotary volume controls; and side surface portions; and a bottom surface portion. Components such as circuit boards are contained in the housing.

The acoustic controller of this type is typically provided with a shielding member which covers circuit boards and electronic components to prevent the circuit boards and the electronic components from being affected by electromagnetic noise caused by external devices or to prevent electromagnetic noise caused by the circuit boards and the electronic components from affecting external devices.

Patent Document 2 (Japanese Patent Application Publication No. 2008-192800) discloses an electronic device including a metal plate and a rubber sheet. The metal plate functioning as a shielding member and a ground is bonded to a portion of an outer surface of a housing, and the rubber sheet covers an outer surface of the metal plate. This metal plate can ground circuit boards and shield electromagnetic noise.

Such an electronic device is provided with a power source separately in many cases. In recent years, however, more and more acoustic controllers contain a power source integrally as a result of reduced sizes of components and larger packing densities on a circuit board.

For example, Patent Document 3 (Japanese Patent Application Publication No. 2008-205582) discloses an acoustic controller which includes an operating-member circuit, an input/output connector board, and a power supply board in a housing constituted by a metal upper unit and a lower casing formed of synthetic resin. In this acoustic controller, input/output connectors are typically disposed at a rear or back of controls or operating members when seen from an operator in a state in which the acoustic controller is placed on a horizontal surface such as a table top. Also, since the heights of the controls and the input/output connectors provided on an operation panel surface are different from each other, the operating-member circuit and the input/output connector board are disposed at different positions in the up and down direction, and the power supply board is disposed under the input/output connector board.

SUMMARY

In an acoustic controller including a power supply board in a housing, electromagnetic shielding is required between the power supply board and a circuit board in the housing to prevent electromagnetic noise caused by the power supply board from affecting another circuit board provided with controls and input/output connectors.

However, if the operating-member circuit, the input/output connector board, and the power supply board are arranged in the housing at different positions in, e.g., the front and rear direction and the up and down direction as in the acoustic controller disclosed in Patent Document 3, the shape and arrangement of the shielding member are complicated, and a larger space is required for the shielding member, which unfortunately obstructs reduction in size of the housing.

This invention has been developed to provide an acoustic controller having a function of electromagnetic shielding and a simple construction of a housing.

The present invention provides an acoustic controller including a housing including: an upper cover; a lower casing constituted by a shielding member; and a lower cover mounted on an opposite side of the lower casing from the upper cover. The lower casing partitions an interior of the housing into (i) an upper space formed by the upper cover and the lower casing and (ii) a lower space formed by the lower casing and the lower cover. A first circuit board is disposed in the upper space, and a second circuit board is disposed in the lower space.

BRIEF DESCRIPTION OF THE DRAWINGS

The objects, features, advantages, and technical and industrial significance of the present invention will be better understood by reading the following detailed description of the embodiment of the invention, when considered in connection with the accompanying drawings, in which.

DETAILED DESCRIPTION OF THE EMBODIMENT

Hereinafter, there will be described one embodiment of the present invention by reference to the drawings.

Figure 1:
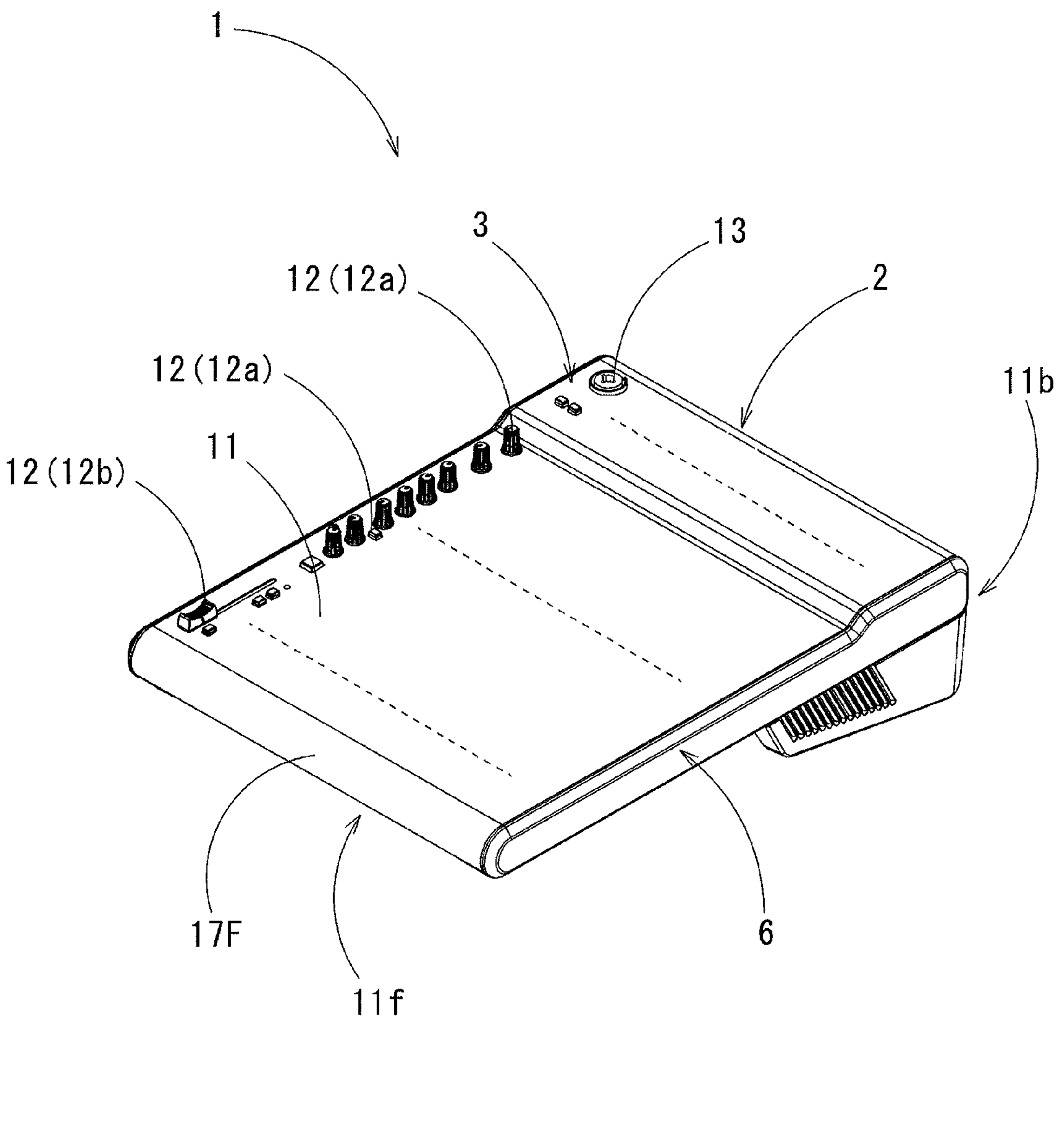
FIG. 1 is a perspective view of an acoustic controller according to one embodiment of the present invention.
Figure 2:
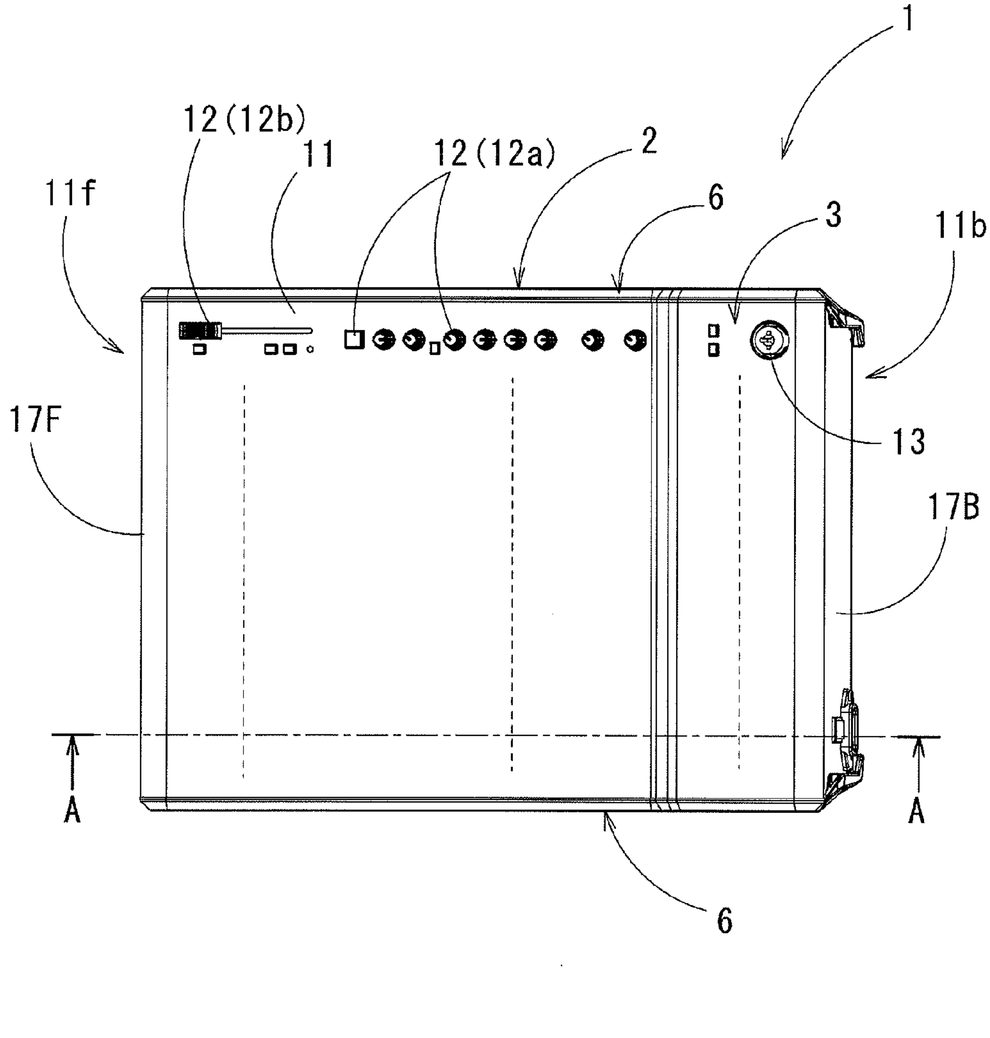
FIG. 2 is a plan view of the acoustic controller illustrated in FIG. 1.
Figure 3:
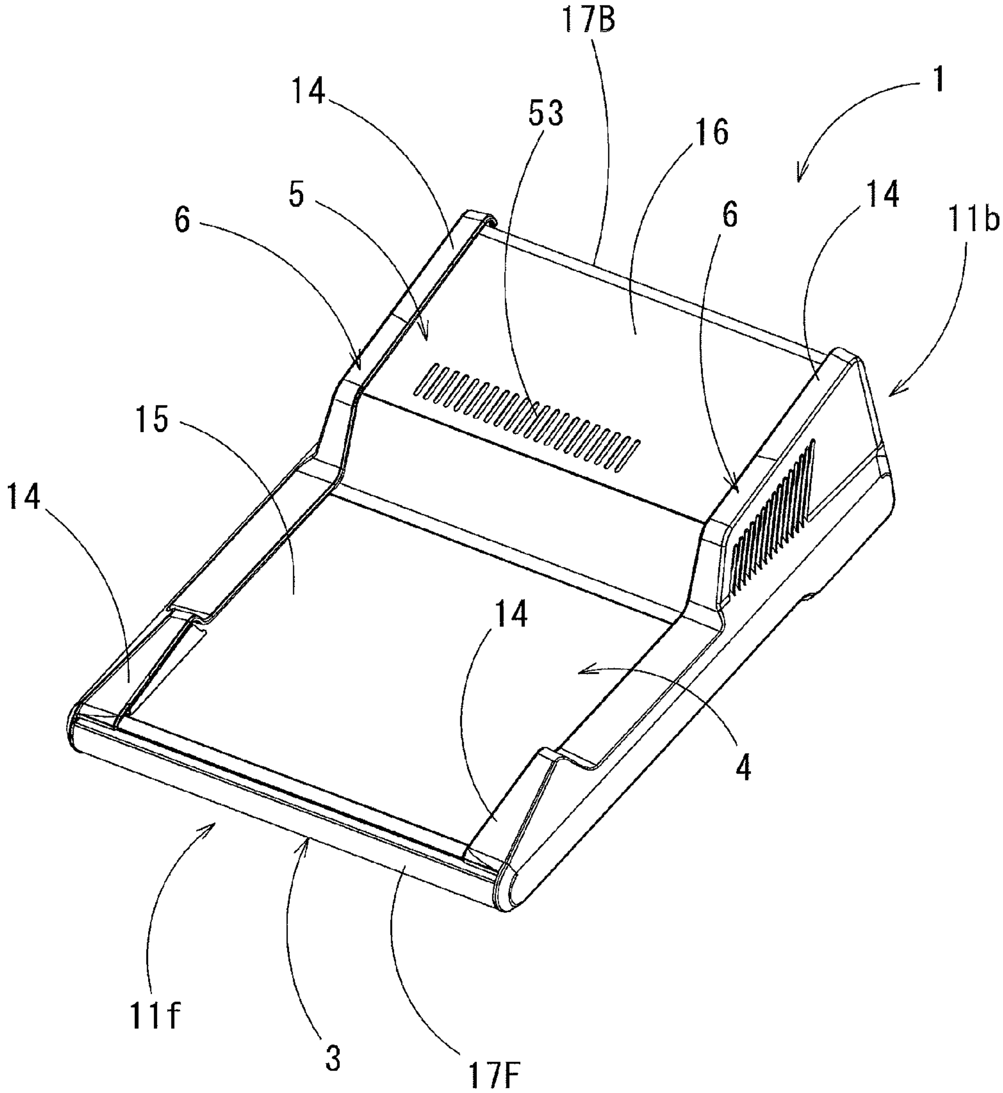
FIG. 3 is a perspective view of a back side of the acoustic controller illustrated in FIG. 1 when seen from obliquely above.

FIGS. 1-3 illustrate an acoustic controller 1, in the form of a mixing console, according to one embodiment of the present invention. An upper surface of the acoustic controller 1 serves as an operation panel surface 11 on which a plurality of controls 12 (as one example of operating members), input/output connectors 13, and other similar components are provided. Though not shown, this acoustic controller 1 is used in a state in which the acoustic controller 1 is connected to other electronic devices such as acoustic devices by audio cables or the like removably connected to the input/output connectors 13. It is noted that the controls 12 and the input/output connectors 13 are provided over generally the entire upper surface of the operation panel surface 11, but the figures illustrate only some of the controls 12 and the input/output connectors 13 and omit illustration of the other (indicated by broken lines).

The acoustic controller 1 is a stationary device which is used in a state in which the acoustic controller 1 is placed on, e.g., a table top or a flat surface. In the state in which the acoustic controller 1 is placed on a horizontal surface, an upper side is defined as a side of the acoustic controller 1 on which the operation panel surface 11 is provided, and a lower side is defined as a side opposite the upper side. When using the acoustic controller 1, a user or an operator is positioned in front of a front surface 11*f* of an upper cover 3 of the acoustic controller 1. Accordingly, unless otherwise specified, a side near the front surface 11*f* of the upper cover 3 is defined as a front side of the acoustic controller 1, a side near a rear surface 11*b* of the upper cover 3 as a rear side of the acoustic controller 1, a right side when seen from the front surface 11*f* toward the rear surface 11*b* as a right side of the acoustic controller 1, a side opposite the right side as a left side of the acoustic controller 1, a side near the operation panel surface 11 as an upper side of the acoustic controller 1, and a side opposite the upper side as a lower side or a back side of the acoustic controller 1.

Figure 5:
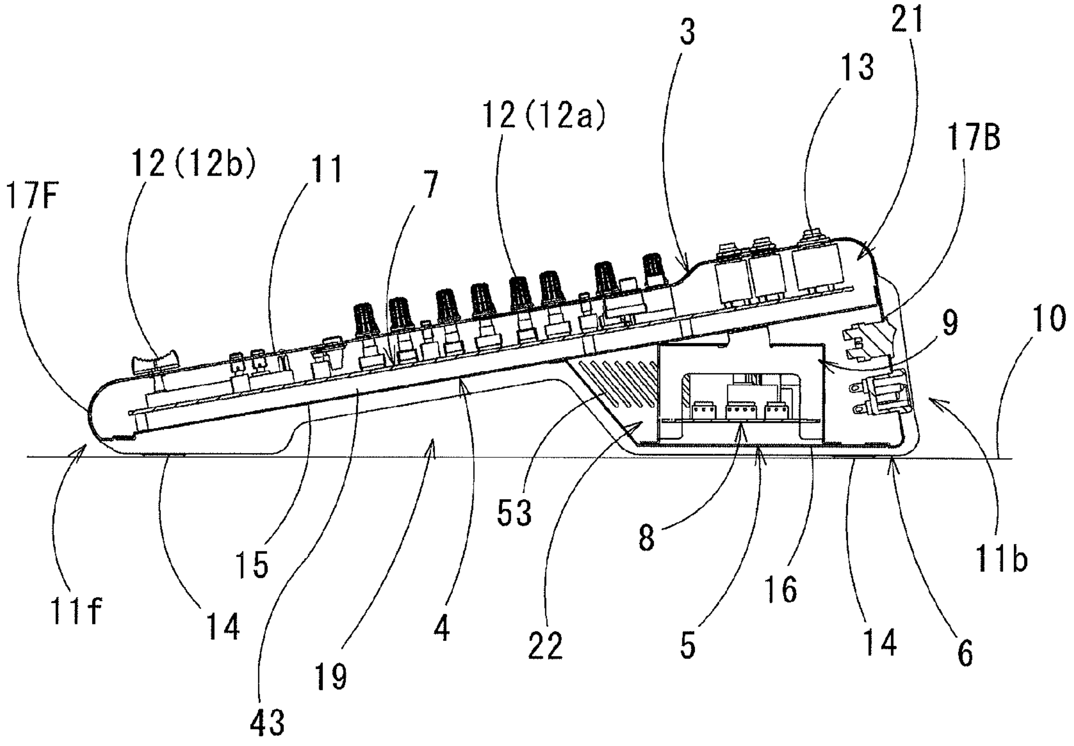
FIG. 5 is a cross-sectional view taken along line A-A in FIG. 2.

As illustrated in FIG. 5, the acoustic controller 1 includes the operation panel surface 11 on its upper side and a plurality of leg portions 14 on its lower side.

Figure 4:
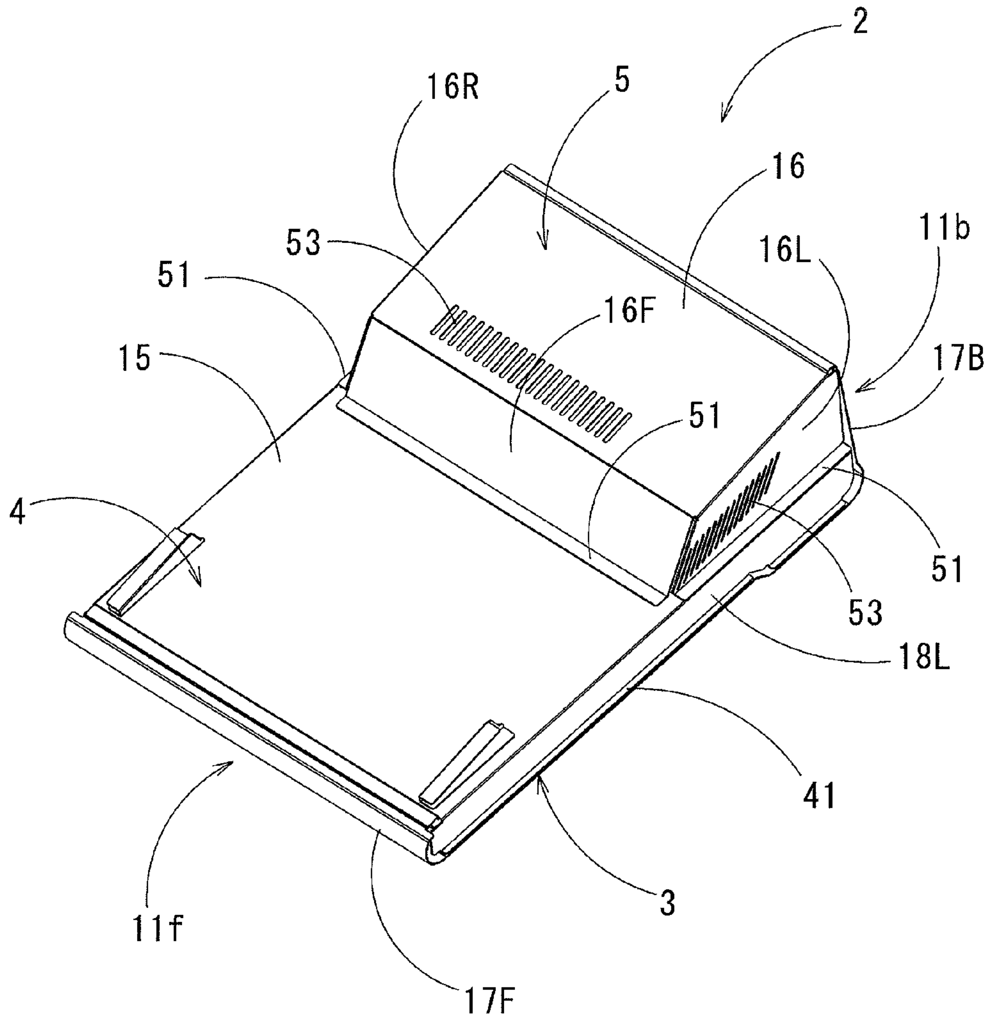
FIG. 4 is a perspective view of the acoustic controller illustrated in FIG. 3 from which side panels are removed.
Figure 6:
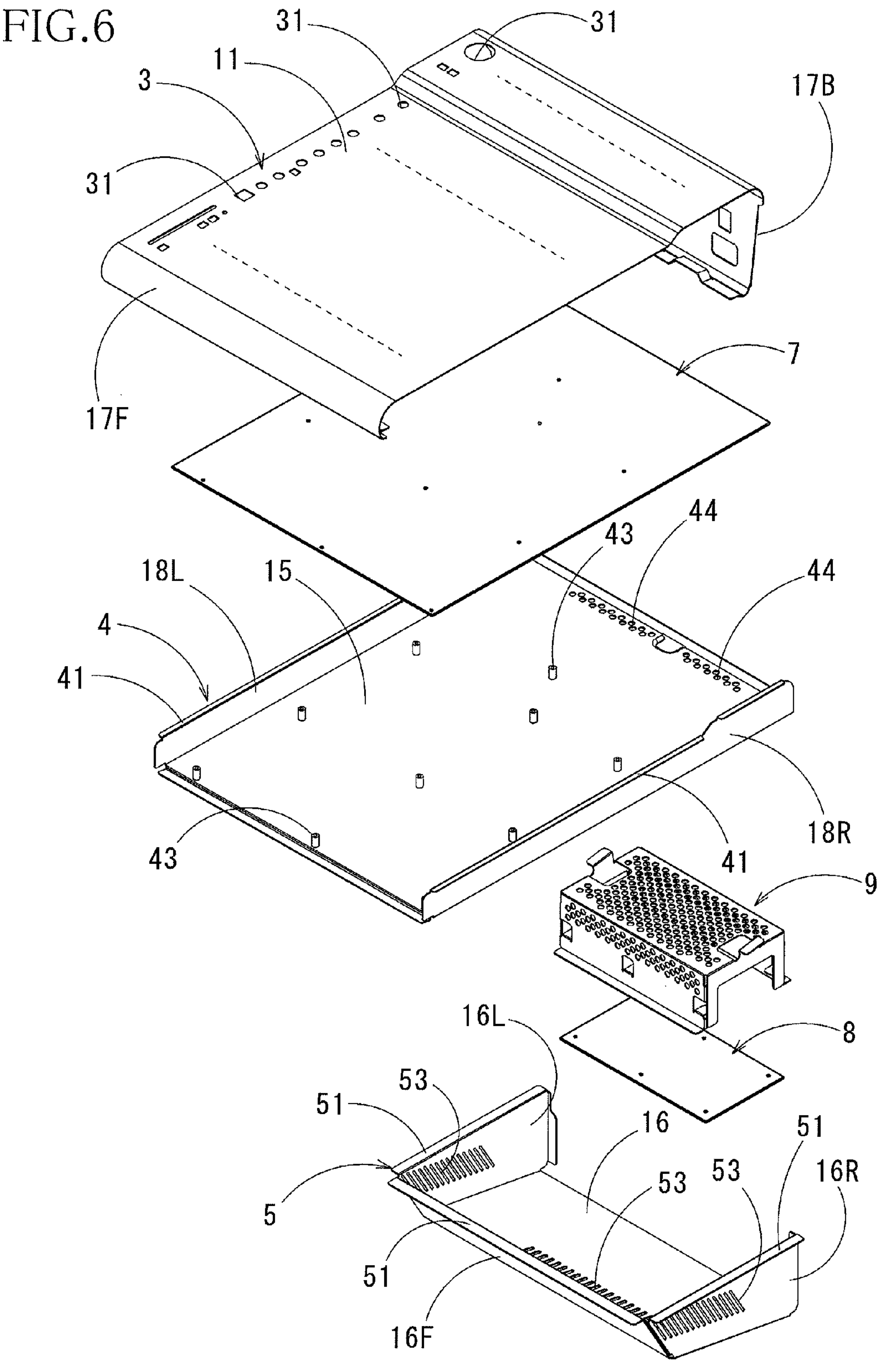
FIG. 6 is an exploded perspective view illustrating a relationship among an upper cover, a circuit board, a lower casing, an attachment member, a power supply board, and a lower cover.

As illustrated in FIG. 6, a housing 2 of the acoustic controller 1 includes: the upper cover 3 having the operation panel surface 11; a lower casing 4 on which the upper cover 3 is mounted; and a lower cover 5 mounted on a back surface of the lower casing 4. In the example illustrated in FIG. 3, in a state in which the upper cover 3, the lower casing 4, and the lower cover 5 are assembled as illustrated in FIG. 4, the housing 2 includes a left surface portion 18L and a right surface portion 18R of a bottom plate 15 which will be described below and a left surface portion 16L and a right surface portion 16R of the lower cover 5. In FIGS. 1-3, side panels 6 are provided on opposite sides of the housing 2 to improve a design of the acoustic controller 1 and provide the leg portions 14, but the side panels 6 may be omitted.

In the stationary state of the acoustic controller 1 illustrated in FIG. 5, the leg portions 14 are held in contact with a table top 10, and the bottom plate 15 of the lower casing 4 and a bottom surface portion 16 (as one example of a placement surface) of the lower cover 5 face the table top 10. Also, the acoustic controller 1 is higher or thicker at its rear portion than at its front portion, so that the operation panel surface 11 inclines downward in the front direction in the stationary state for easier operation for user. It is noted that the operation panel surface 11 may be provided in parallel with the table top 10 in the stationary state. It is noted that the operation panel surface 11 is substantially parallel with the bottom plate 15 in the state in which the upper cover 3 is mounted on the lower casing 4.

As illustrated in FIG. 5, an interior of the housing 2 is partitioned by the lower casing 4 into (i) an upper space 21 defined by the upper cover 3 and the lower casing 4 and (ii) a lower space 22 defined by the lower casing 4 and the lower cover 5. A circuit board 7 as one example of a first circuit board on which the controls 12 and the input/output connectors 13 are provided is disposed in the upper space 21, and a power supply board 8 as one example of a second circuit board is disposed in the lower space 22.

The upper cover 3 is formed of metal such as aluminum. As illustrated in FIG. 6, the upper flat surface of the upper cover 3 serves as the operation panel surface 11, and a front portion and a rear portion of the operation panel surface 11 are bent downward to form a front surface portion 17F and a rear surface portion 17B of the acoustic controller 1. Since the front surface portion 17F and the rear surface portion 17B are thus formed by bending the operation panel surface 11, the flexural rigidity of the upper cover 3 in the right and left direction is increased.

The operation panel surface 11 has a plurality of connector openings 31 for exposing the controls 12 and the input/output connectors 13 mounted on the circuit board 7. The heights of the input/output connectors 13 are typically higher than the heights of the controls 12. Thus, the operation panel surface 11 is formed such that a portion thereof on which the input/output connectors 13 are mounted is higher than the other portion thereof so as to match the heights of the controls 12 and the input/output connectors 13.

It is noted that the upper cover 3 is constituted by a single component including the operation panel surface 11, the front surface portion 17F, and the rear surface portion 17B as illustrated in, e.g., FIG. 6 but may be constituted by a plurality of components in combination.

The lower casing 4 is formed of metal such as iron and stainless steel for electromagnetic shielding. As illustrated in FIG. 6, the lower casing 4 includes: the flat bottom plate 15 formed along a back surface of the circuit board 7; and the left surface portion 18L and the right surface portion 18R formed by bending left and right portions of the bottom plate 15 upward.

Upper portions of the left surface portion 18L and the right surface portion 18R extending in the front and rear direction and projecting from the bottom plate 15 are bent outward in the right and left direction to provide flange portions 41 on the respective surface portions 18L, 18R. These flange portions extend in the front and rear direction over the entire length of the lower casing 4, resulting in increased flexural rigidity of the respective surface portions 18L, 18R in the front and rear direction and accordingly in higher stiffness of the lower casing 4 in the front and rear direction. This bottom plate 15 of the lower casing 4 is generally similar in size to the operation panel surface 11 of the upper cover 3 and secured under the upper cover 3 to define the upper space 21.

A plurality of supports 43 for securing the circuit board 7 stand on the bottom plate 15. The circuit board 7 is secured to upper end surfaces of the respective supports 43 provided on the bottom plate 15. A plurality of projections, not shown, for supporting a peripheral portion of the circuit board 7 may be provided on inner surfaces of the respective left and right surface portions 18L, 18R of the lower casing 4. With this construction, the circuit board 7 is disposed over the bottom plate 15 so as to be generally parallel with the bottom plate 15.

As illustrated in FIG. 5, the controls 12 are provided on the circuit board 7 and exposed upward from the operation panel surface 11 in the state in which the upper cover 3 is mounted. The controls 12 include function controls 12*a* (e.g., switches and rotary volumes) and fader controls 12*b* for controlling a fader, as components of the mixing console. Upper end portions of the input/output connectors 13 provided on a rear portion of the circuit board 7 are exposed upward at the rear portion of the operation panel surface 11 of the upper cover 3.

On an opposite side of the lower casing 4 from the upper cover 3, the power supply board 8 covered with the lower cover 5 is disposed at an area located under the input/output connectors 13.

As illustrated in FIG. 4, the lower cover 5 is provided on a rear portion of the bottom plate 15 of the lower casing 4 in the front and rear direction over the entire length of the bottom plate 15 in the right and left direction. The lower cover 5 is constituted by a shielding member formed of, e.g., iron or stainless steel. As illustrated in FIG. 6, the lower cover 5 includes the flat bottom surface portion 16, the left surface portion 16L, a right surface portion 16R, and a front surface portion 16F. The left surface portion 16L, the right surface portion 16R, and the front surface portion 16F are formed by bending left, right, and front portions of the bottom surface portion 16 upward. The power supply board 8 is covered with the rear surface portion 17B of the upper cover 3 and the lower cover 5.

The bottom surface portion 16 inclines with respect to the operation panel surface 11. In the stationary state of the acoustic controller 1, the bottom surface portion 16 is parallel with the table top 10, and the operation panel surface 11 inclines toward the front surface 11*f* with a downward gradient. It is noted that the operation panel surface 11 may be provided so as to be parallel with the table top 10. As illustrated in FIG. 5, the bottom surface portion 16 is formed so as to incline with respect to the bottom plate 15 in the state in which the lower cover 5 is mounted on the lower casing 4. That is, the bottom surface portion 16 is formed such that the distance between the bottom plate 15 and the bottom surface portion 16 gradually increases in the rear direction.

Upper portions of the left surface portion 16L, the right surface portion 16R, and the front surface portion 16F extending in their respective longitudinal directions on a horizontal plane and projecting from the bottom surface portion 16 of the lower cover 5 are bent outward to provide flange portions 51 on the respective surface portions 16L, 16R, 16F. These flange portions 51 increase the flexural rigidity of the lower cover 5, and the lower cover 5 are secured to the bottom plate 15 via the flange portions 51.

It is noted that the power supply board 8 is secured to the lower cover 5 by an attachment member indicated by the reference number "9" in FIG. 5 and surrounded by the lower cover 5 and the rear surface portion 17B of the upper cover 3. The power supply board 8 is covered with the attachment member 9, the rear surface portion 17B, the left and right surface portions 16L, 16R, and the front surface portion 16F in the front, rear, left, and right directions and covered with the bottom plate 15 and the bottom surface portion 16 in the up and down directions, with the power supply board 8 being substantially parallel with the bottom surface portion 16. It is noted that the attachment member 9 may be constituted by a shielding member.

The lower cover 5 is mounted on a back surface of the rear portion of the inclined bottom plate 15, so that as illustrated in FIG. 5, the bottom plate 15, the front surface portion 16F of the lower cover 5, and the table top 10 define, on a back side of the acoustic controller 1, a recessed portion 19 whose top is located at its rear portion. This recessed portion 19 is formed over the entire width of the lower casing 4 in the right and left direction so as to communicate with spaces on opposite sides of the acoustic controller 1 in the right and left direction in the stationary state of the acoustic controller 1.

In the acoustic controller 1 having the above-described construction, the lower casing 4 partitions the interior of the housing 2 into (a) the upper space 21 defined by the upper cover 3 and the lower casing 4 and (b) the lower space 22 defined by the lower casing 4 and the lower cover 5, and the circuit board 7 and the power supply board 8 are respectively disposed in the upper space 21 and the lower space 22 separated by the bottom plate 15 of the lower casing 4.

Figure 7:
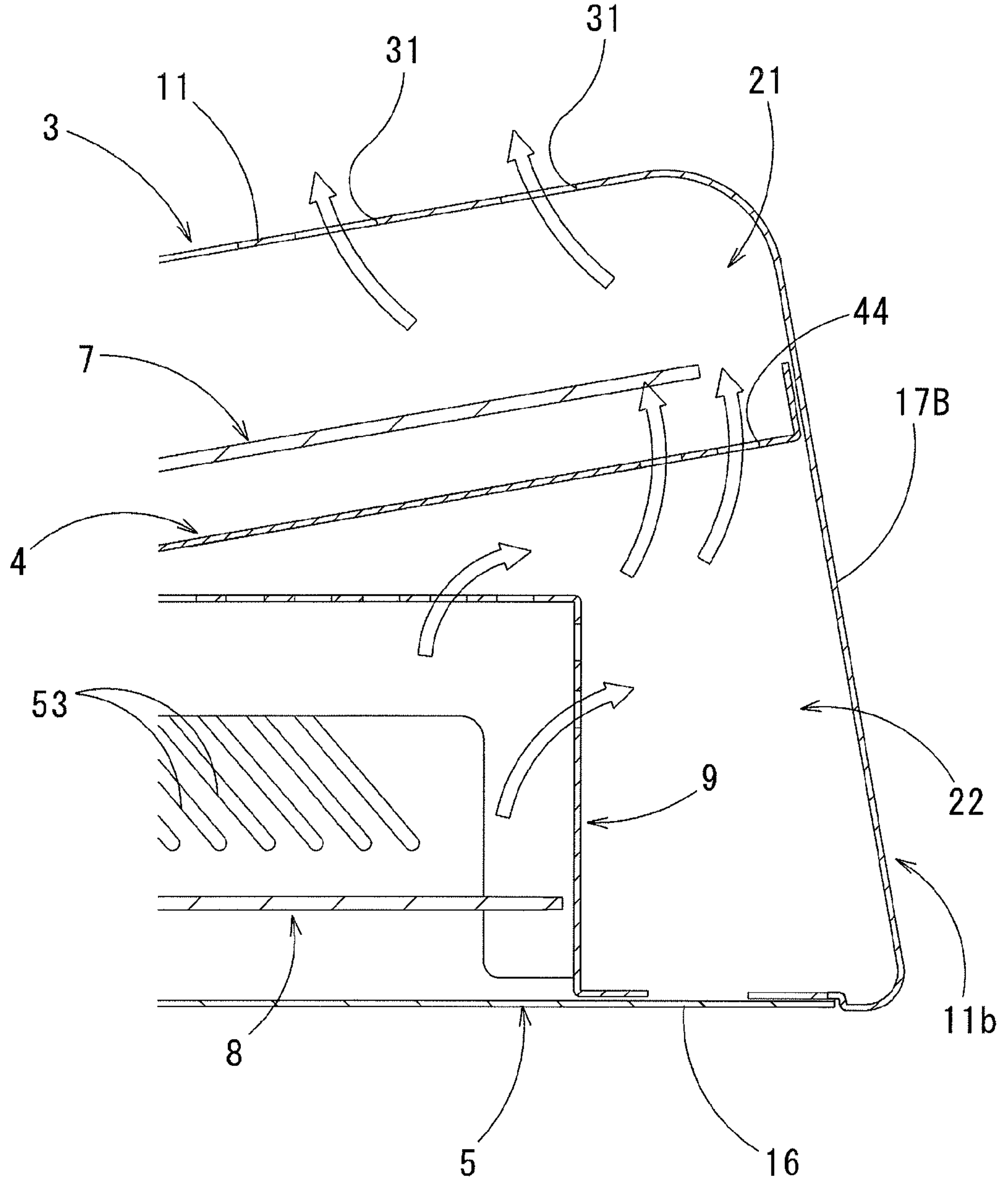
FIG. 7 is an enlarged cross-sectional view illustrating a portion of the acoustic controller illustrated in FIG. 5, with some components such as controls being removed.

As illustrated in FIGS. 6 and 7, a rear portion of the bottom plate 15 of the lower casing 4 has a plurality of round communication openings 44 at positions located at a rear of the attachment member 9, and these communication openings 44 establish communication between the upper space 21 and the lower space 22 to enable air to communicate between the upper space 21 and the lower space 22 (noted that the bottom plate 15 may have a single communication opening 44). It is noted that the shape of each of the communication openings 44 is not limited to a round shape or a square shape, and slits may be formed as the communication openings 44, for example. In addition, the arrangement and the shape of the communication openings 44 may be determined as needed according to paths for discharging heat emitted by the circuits. Also, some or all of the communication openings 44 may serve as holes for cables electrically connecting between the circuit board 7 and so on disposed in the upper space 21 and the power supply board 8 and so on disposed in the lower space 22. A plurality of heat dissipating slits 53 are formed in the left and right surface portions 16L, 16R of the lower cover 5 and the bottom surface portion 16 so as to enable air to communicate between the lower space 22 and the outside space. It is noted that the heat dissipating slits 53 may be formed in other portions.

In the construction in which the heat dissipating slits 53 are formed in the bottom surface portion 16, the leg portions 14 are preferably provided such that a space for ventilation is formed between the bottom surface of the acoustic controller 1 and the table top in the state in which the acoustic controller 1 is placed on, e.g., the table top, but the construction of the leg portions 14 is not limited to one illustrated in FIG. 5.

In the acoustic controller 1 constructed as described above, the lower casing 4 constituted by the shielding member partitions the interior of the housing 2 into the upper space 21 and the lower space 22, whereby electromagnetic noise caused by the power supply board 8 disposed in the lower space 22 is interrupted by the lower casing 4, making it difficult for the electromagnetic noise caused by the power supply board 8 to leak to the upper space 21. This construction greatly reduces effects of the electromagnetic noise on the circuit board 7 due to the power supply board 8 provided in the acoustic controller 1.

It is noted that the upper cover 3 formed of, e.g., aluminum has a shielding effect against electric field.

The controls 12 and the input/output connectors 13 are provided on the single flat circuit board 7. This construction allows the single flat lower casing 4 to partition the interior of the acoustic controller 1 into the upper space 21 and the lower space 22, resulting in a simple construction in the interior of the housing 2.

The lower casing 4 constitutes a shielding plate for shielding the electromagnetic noise and partly constitutes an exterior of the acoustic controller 1. This construction eliminates a need for additionally providing a shielding plate for noise shielding and exterior components as in the conventional technique, resulting in the reduced number of components. Furthermore, this construction leads to a simple construction and reduction in size of the acoustic controller 1. As a result, it is possible to reduce component cost and manufacturing cost.

The acoustic controller 1 is constructed such that the operation panel surface 11 is higher at its rear portion than at its front portion in the state in which the acoustic controller 1 is stationarily placed. This construction facilitates operations of the user, but heat is easily kept in the interior of the high rear portion of the housing 2.

In the acoustic controller 1 according to the present embodiment, heat is generated mainly by the power supply board 8, but as indicated by white arrows in FIG. 7 the communication openings 44 formed in the rear portion of the lower casing 4 allows air heated by the power supply board 8 to flow from the lower space 22 to the upper space 21. Furthermore, since the height of the rear portion of the operation panel surface 11 is higher than that of the front portion thereof, heated air is easily discharged from openings opening in the operation panel surface 11 such as the connector openings 31. It is noted that the operation panel surface 11 may have other heat dissipating openings in addition to the connector openings 31.

External air flowing from the heat dissipating slits 53 into the lower cover 5 flows into the upper space 21 from the communication openings 44 formed in the bottom plate 15, that is, the construction of the acoustic controller 1 generates smooth air flow, making it easier for air to flow upward through the connector openings 31 and the like formed in the operation panel surface 11.

Accordingly, the power supply board 8 and the input/output connectors 13 of the circuit board 7 can be effectively cooled, that is, the acoustic controller 1 provides a good heat dispersion characteristic even in the interior of the reduced-size housing.

While the embodiment of the present invention has been described above, it is to be understood that the invention is not limited to the details of the illustrated embodiment, but may be embodied with various changes and modifications, which may occur to those skilled in the art, without departing from the spirit and scope of the invention.

For example, the circuit board 7 provided with the controls 12 and the input/output connectors 13 is disposed in the upper space 21 of the housing 2, and the power supply board 8 is disposed in the lower space 22 in the above-described embodiment, but the present invention is not limited to this construction. The present invention is applicable to techniques for shielding electromagnetic effects of the electronic component (i.e., the first circuit board) disposed in the upper space 21 and the electronic component (i.e., the second circuit board) disposed in the lower space 22. A circuit board provided with, e.g., a digital signal processing circuit which operates at high frequency may be disposed in the lower space 22 instead of or in addition to the power supply board 8. Also, a circuit board provided with, e.g., circuit components of different types may be disposed in the upper space 21 instead of or in addition to the circuit board 7.

The material of the components of the housing 2 is not limited to metal. To form each component, for example, a metal layer or the like functioning as a shielding member against electromagnetic waves may be covered with or bonded to a resin component.

What is claimed is:

1. An acoustic controller comprising a housing comprising: an upper cover; a lower casing constituted by a shielding member; and a lower cover mounted on an opposite side of the lower casing from the upper cover, the lower casing partitioning an interior of the housing into (i) an upper space defined by a lower-side surface of the upper cover and an upper-side surface of the lower casing and (ii) a lower space defined by a lower-side surface that is opposite the upper-side surface of the lower casing and an upper-side surface of the lower cover, a first circuit board being disposed in the upper space and being interposed between the lower-side surface of the upper cover and the upper-side surface of the lower casing, a second circuit board being disposed in the lower space and being interposed between the lower-side surface of the lower casing and the upper-side surface of the lower cover.

2. The acoustic controller according to claim 1, wherein the upper cover comprises a planar panel surface as the lower-side surface of the upper cover, and wherein the lower casing comprises a planar bottom plate surface which is substantially parallel with the panel surface in a state in which the upper cover is mounted on the lower casing.

3. The acoustic controller according to claim 1, wherein the lower casing comprises a planar bottom plate surface as the upper-side surface of the lower casing, and wherein the first circuit board is disposed in the upper space in a state in which the first circuit board is substantially parallel with the bottom plate surface.

4. The acoustic controller according to claim 1, wherein the lower casing comprises a planar bottom plate surface as the upper-side surface of the lower casing, and wherein the lower cover comprises a planar placement surface as the upper-side surface of the lower cover, and a distance between the placement surface and the bottom plate surface increases in a rear direction in a state in which the lower cover is mounted on the lower casing.

5. The acoustic controller according to claim 1, wherein the lower cover comprises a planar placement surface as the upper-side surface of the lower cover, and wherein the second circuit board is disposed in the lower space in a state in which the second circuit board is substantially parallel with the placement surface.

6. The acoustic controller according to claim 1, wherein the lower cover is mounted on a rear portion of the lower casing.

7. The acoustic controller according to claim 1, further comprising a plurality of operating members, wherein the first circuit board is a circuit board provided with the plurality of operating members, and wherein the second circuit board is a power supply board.

8. The acoustic controller according to claim 7, wherein a rear portion of the housing is greater in height than a front portion of the housing in a state in which the housing is placed on a horizontal surface, wherein an input/output connector is disposed on a rear portion of the first circuit board provided with the plurality of operating members, and the power supply board is disposed under the input/output connector, and wherein a rear portion of the lower casing is formed with a communication opening establishing communication between the upper space and the lower space.

* * * * *